(12) United States Patent
Pekka Herzogenrath et al.

(10) Patent No.: US 10,294,095 B2
(45) Date of Patent: May 21, 2019

(54) MICROMECHANICAL SENSOR AND METHOD FOR PRODUCING A MICROMECHANICAL SENSOR

(71) Applicant: Robert Bosch GmbH, Stuttgart (DE)

(72) Inventors: Benny Pekka Herzogenrath, Stuttgart (DE); Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/582,333

(22) Filed: Apr. 28, 2017

(65) Prior Publication Data
US 2017/0341927 A1   Nov. 30, 2017

(30) Foreign Application Priority Data
May 24, 2016   (DE) .................. 10 2016 208 925

(51) Int. Cl.
| | | |
|---|---|---|
| H01L 29/84 | (2006.01) |
| B81B 3/00 | (2006.01) |
| B81C 1/00 | (2006.01) |
| G01C 19/5712 | (2012.01) |
| G01P 15/125 | (2006.01) |
| G01C 19/56 | (2012.01) |
| G01C 19/5656 | (2012.01) |
| G01P 1/00 | (2006.01) |
| G01P 15/08 | (2006.01) |

(52) U.S. Cl.
CPC ........ B81B 3/0008 (2013.01); B81C 1/00174 (2013.01); B81C 1/00476 (2013.01); G01C 19/56 (2013.01); G01C 19/5656 (2013.01); G01C 19/5712 (2013.01); G01P 1/003 (2013.01); G01P 15/0802 (2013.01); G01P 15/125 (2013.01); *B81B 2201/025* (2013.01); *B81B 2201/0235* (2013.01); *B81B 2201/0242* (2013.01); *B81B 2203/0181* (2013.01); *B81B 2203/0338* (2013.01); *B81C 2201/0132* (2013.01); *G01P 2015/0814* (2013.01); *G01P 2015/0831* (2013.01); *G01P 2015/0834* (2013.01); *G01P 2015/0837* (2013.01)

(58) Field of Classification Search
CPC .................................................. B81B 3/0008
USPC ................. 257/415, 416, 417, 418
See application file for complete search history.

(56) References Cited

U.S. PATENT DOCUMENTS

| | | | | |
|---|---|---|---|---|
| 2012/0237073 A1* | 9/2012 | Goida | ...................... | H04R 1/02 381/361 |
| 2014/0264656 A1* | 9/2014 | Ata | ........................ | B81B 3/001 257/416 |

FOREIGN PATENT DOCUMENTS

| | | |
|---|---|---|
| DE | 10 2009 000 167 A1 | 7/2010 |
| EP | 0 244 581 A1 | 11/1987 |
| EP | 0 773 443 B1 | 5/2000 |

* cited by examiner

*Primary Examiner* — Tan N Tran
(74) *Attorney, Agent, or Firm* — Maginot, Moore & Beck LLP

(57) ABSTRACT

A micromechanical sensor that is produced surface-micromechanically includes at least one mass element formed in a third functional layer that is non-perforated at least in certain portions. The sensor has a gap underneath the mass element that is formed by removal of a second functional layer and at least one oxide layer. The removal of the at least one oxide layer takes place by introducing a gaseous etching medium into a defined number of etching channels arranged substantially parallel to one another. The etching channels are configured to be connected to a vertical access channel in the third functional layer.

15 Claims, 15 Drawing Sheets

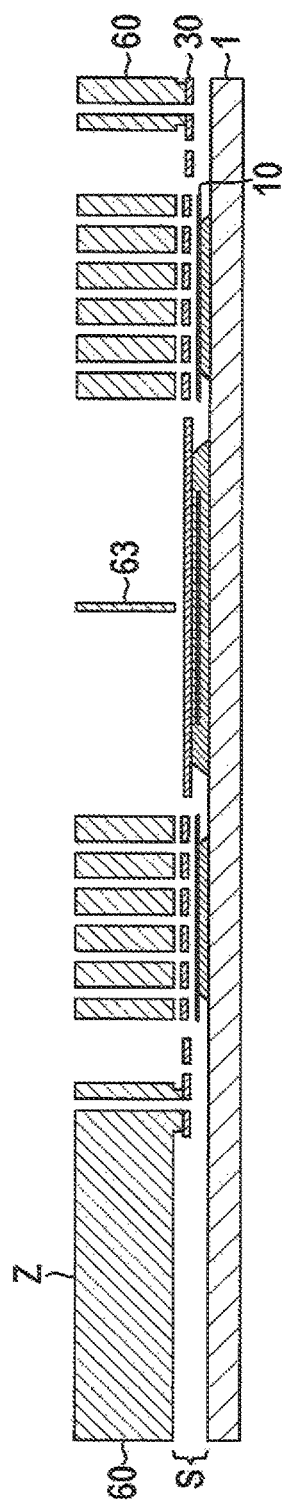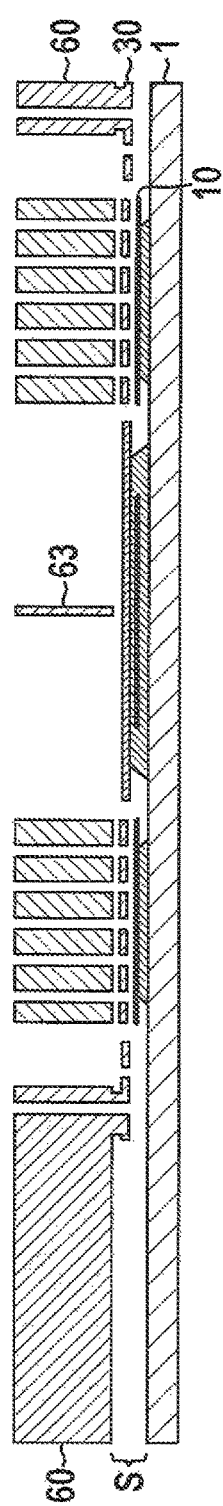
Fig. 8

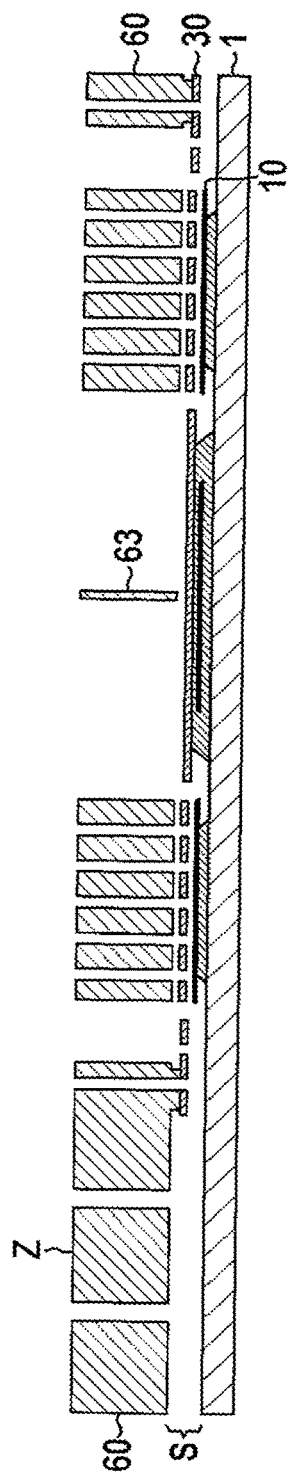
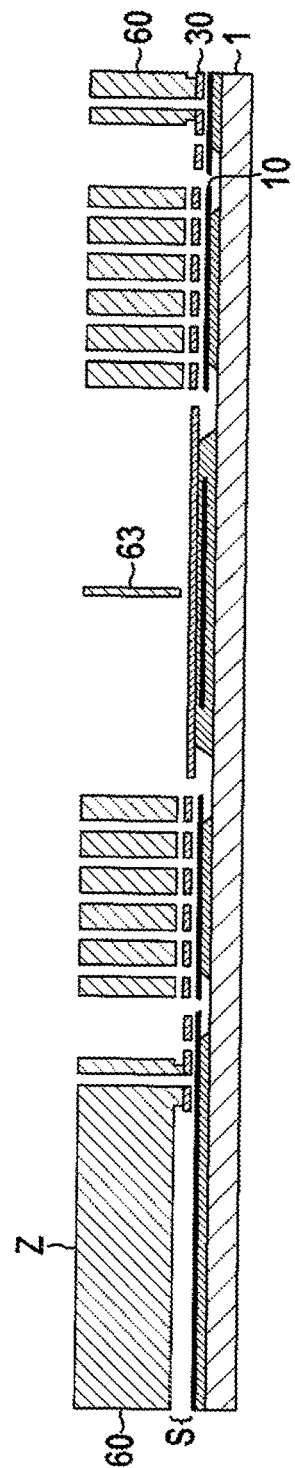

MICROMECHANICAL SENSOR AND METHOD FOR PRODUCING A MICROMECHANICAL SENSOR

This application claims priority under 35 U.S.C. § 119 to patent application no. DE 10 2016 208 925.0, filed on May 24, 2016 in Germany, the disclosure of which is incorporated herein by reference in its entirety.

BACKGROUND

The disclosure relates to a micromechanical sensor. The disclosure also relates to a method for producing a micromechanical sensor.

Micromechanical inertial sensors for measuring acceleration and rate of rotation are mass produced for various applications in the automobile and consumer sectors. For capacitive acceleration sensors with a direction of detection perpendicular to the wafer level (z direction), rockers are preferably used. The sensor principle of these rockers is based on a spring-mass system, in which in the simplest case a movable seismic mass with two counterelectrodes fixed on the substrate forms two plate capacitors. The seismic mass is connected to the substrate by way of a torsion spring. If the mass structures on the two sides of the torsion spring are of different sizes, under the effect of a z acceleration the mass structure will turn in relation to the torsion spring as an axis of rotation. Such a difference in mass is brought about for example by an additional mass, as shown in FIGS. 1 and 2. In this way, the distance between the electrodes becomes smaller on the side with the greater mass and greater on the other side. The change in capacitance is a measure of the acceleration acting. Such acceleration sensors are known from numerous patent specifications, for example from EP 0 244 581 and EP 0 773 443 B1.

The standard rockers are of a simple construction and are widely used, but have several technical problems that make them unsuitable for applications with very high requirements for offset stability, or that require very high costs, for example during packaging, in the application and when testing in order to make them suitable for high-performance applications. Among the effects that may adversely influence the offset or zero-point stability are the following:

a) The construction is sensitive to instances of substrate bending, for example caused by housing stress, in particular asymmetrical connections, in which for example an average distance between two electrodes varies. A resultant capacitance between the seismic mass and a first electrode then already deviates from the capacitance between the seismic mass and the second electrode without any acceleration signal, resulting in an offset signal. This offset is generally also dependent on the temperature, since housing stress and instances of substrate bending are temperature-dependent.

b) In the region of the additional mass, an undesired electrostatic force acts between the movable structure and the substrate, since an electrical voltage, for example a pulsed square-wave voltage, is applied to the movable structure for the capacitive evaluation, while the substrate is at ground potential. This force leads to a parasitic deflection of the rocker. To minimize the electrostatic interactions, usually arranged on the substrate in the region of the additional mass is an additional conductor track area, to which the same potential is applied as to the movable structure. Theoretically, this allows a freedom from forces to be achieved between the additional mass and the substrate. In practice, however, there may be significant electrical surface charges on the conductor track area connected to the substrate and/or on the underside of the movable structure, which can still lead to parasitic forces, and consequently offset signals. These effects are particularly critical if they change with temperature or over the lifetime of the product, since this leads to offset drifts, which cannot be corrected by the final adjustment of the component.

Surface-micromechanically produced z acceleration sensors according to the rocker principle generally have perforation holes both in the region of the electrodes and in the region of the additional mass. The holes are required in the case of most methods of surface-micromechanical production because these holes represent access channels for the so-called gas-phase etching, in which the sacrificial oxide between the movable structure and the conductor track level lying thereunder or the substrate is removed by way of a gaseous HF atmosphere to release the sensor.

The perforation holes also have the advantage in many cases that, with a multi-channel sensor (xz, yz or xyz sensor), the damping of the z sensor does not become too great, and in particular will not be significantly above the damping of the lateral sensor. It is advantageous if, with a multi-channel sensor, the mechanical transmission functions (i.e. resonant frequency and damping) of all the channels lie in a similar range. As a result, specific requirements for the mechanical bandwidth and/or vibrational robustness can be satisfied particularly well and without differentiation between the individual channels in the specification.

On the other hand, an advantage of a non-perforated mass structure is the greater mass per unit area, which leads to an increased mechanical sensitivity (or else with the same sensitivity to a reduced space requirement). The higher mass density of a non-perforated structure can alternatively be used beneficially for increasing the spring stiffness, and consequently for reducing the stiction tendency of the sensor.

To improve the mentioned disruptive effects a), b), some years ago novel z sensor designs and technologies were proposed, disclosed for example in DE 10 2009 000 167 A1. A structure disclosed therein displays a significantly improved robustness with respect to instances of substrate bending (differential electrode principle comprising a top electrode and a bottom electrode) and with respect to surface charges on account of the symmetrization of the underside of the movable structure with respect to the conductor track level).

To provide an overview, the strengths and weaknesses of the various z sensor concepts according to the prior art are summarized in the following table:

TABLE 1

|  | Standard rocker | Rocker according to FIG. 4 | Non-perforated rocker |
| --- | --- | --- | --- |
| Robustness with respect to substrate bending | − | + | − |
| Robustness with respect to surface charges | − | + | − |
| Damping adjustable and comparable to x/y sensor | + | + | − |
| Mechanical sensitivity | 0 | − | + |
| Restoring force |  |  |  |

TABLE 1-continued

|  | Standard rocker | Rocker according to FIG. 4 | Non-perforated rocker |
|---|---|---|---|
| Small overall height | 0 | 0/+ (+ top/bottom electrodes, but additional masses on both sides of the rocker) | 0/+ |

+ . . . satisfied
− . . . not satisfied
0 . . . partially satisfied

SUMMARY

An object of the present disclosure is therefore to provide a micromechanical sensor that is improved with respect to the aforementioned concepts.

The object is achieved according to a first aspect by a micromechanical sensor, wherein the micromechanical sensor can be produced surface-micromechanically, comprising:
  at least one mass element, which is formed in a third functional layer and non-perforated, at least in certain portions; wherein
  a gap can be produced underneath the mass element by removal of a second functional layer and at least one oxide layer; wherein
  the removal of the at least one oxide layer takes place by means of introducing a gaseous etching medium into a defined number of etching channels arranged substantially parallel to one another; wherein
  the etching channels can be connected to a vertical access channel in the third functional layer.

In this way, a mechanical sensitivity and a restoring force of the micromechanical sensor are advantageously increased. By means of a surface-micromechanical method, an unperforated mass is provided in this way for a micromechanical sensor with an increased gap between the unperforated mass and the layer lying thereunder. As a result, an effect of electrostatic forces can be advantageously reduced. A flexible configuration of the second functional layer advantageously allows a gap width to be adapted in this way to specific sensor requirements.

According to a second aspect, the disclosure provides a method for the surface-micromechanical production of a micromechanical sensor, comprising the steps of:
  forming layer by layer a first functional layer, a second functional layer and a third functional layer, an oxide layer being respectively formed between the functional layers;
  removing the second functional layer in a defined manner and forming a defined number of lateral oxidized etching channels in the region of the second functional layer;
  forming a vertical access channel into the lateral etching channels; and
  removing the oxide layers in a defined manner by introducing a gaseous etching medium into the lateral etching channels.

Preferred embodiments of the micromechanical sensor are the subject of dependent claims.

An advantageous embodiment of the micromechanical sensor is distinguished by the fact that the gap is about two to about ten times, preferably about three to about six times, greater than a gap between a movable portion of the third functional layer and a layer lying thereunder. As a result, an efficient reduction of the electrostatic forces between the third functional layer and the layer lying thereunder is obtained.

A further advantageous development of the micromechanical sensor is characterized in that the gap between the unperforated region of the third functional layer and the layer lying thereunder is about five µm to about eight µm, preferably about seven µm. On account of the fact that the electrostatic forces increase by a power of two in relation to increasing distance, in this way an effective reduction of the parasitic electrostatic between the substrate and the movable mass of the sensor can be brought about.

A further advantageous development of the micromechanical sensor provides that a defined number of through-holes formed in a defined manner are formed in the mass element of the third functional layer. In this way, a mechanical degree of damping of the movable mass can be advantageously set.

A further advantageous development of the micromechanical sensor is distinguished by the fact that a conductor track level is formed in a first functional layer underneath the unperforated region of the third functional layer. With the presence of a conductor track level, a defined electrical potential can be advantageously set on the conductor track level. A variety of designs for the micromechanical sensor is in this way advantageously increased.

A further advantageous development of the micromechanical sensor is distinguished by the fact that the first functional layer is also removed underneath the unperforated region of the third functional layer. In this way, the gap between the movable mass and the layer lying thereunder can be increased further.

BRIEF DESCRIPTION OF THE DRAWINGS

The disclosure is described in detail below with further features and advantages on the basis of several figures. In this case, all of the disclosed features form the subject matter of the present disclosure, irrespective of the back-references relating to them in the patent claims and irrespective of how they are presented in the description and in the figures. Elements that are the same or functionally the same have the same designations. The figures are intended in particular to illustrate the principles that are essential to the disclosure and are not necessarily to scale.

Disclosed method features are obtained analogously from corresponding disclosed device features, and vice versa. This means in particular that features, technical advantages and embodiments concerning the micromechanical sensor are obtained in an analogous way from corresponding embodiments, features and advantages concerning the method for producing a micromechanical sensor, and vice versa.

In the figures:
FIGS. 8-9 show views of further embodiments of the micromechanical sensor according to the disclosure;
FIG. 10 shows a further embodiment of the micromechanical sensor according to the disclosure;
FIG. 11 shows a further embodiment of the micromechanical sensor according to the disclosure.

DETAILED DESCRIPTION

The essence of the disclosure is the use of a mass that is not perforated (or only very sparsely perforated), at least in certain portions, for a micromechanical sensor (for example a z acceleration sensor, a lateral acceleration sensor, a rate-of-rotation sensor, etc.) in the case of which, by contrast with known micromechanical sensors, a distance from a layer lying thereunder (for example a substrate) in the region of the mass is greatly increased. The increased distance in comparison with the prior art allows an electrostatic interaction with the layer lying thereunder to be minimized, and also a squeeze film damping in the region of the additional mass is not formed as all that great in comparison with the damping of a lateral sensor. The non-perforated additional mass is advantageously combined with a fully differential electrode arrangement of a rocker, in order to allow its low sensitivity to instances of substrate bending and a high capacitance density (useful capacitance per unit area).

The arrangement according to the disclosure is obtained by a specific way of conducting a surface-micromechanical process.

Figure 1:
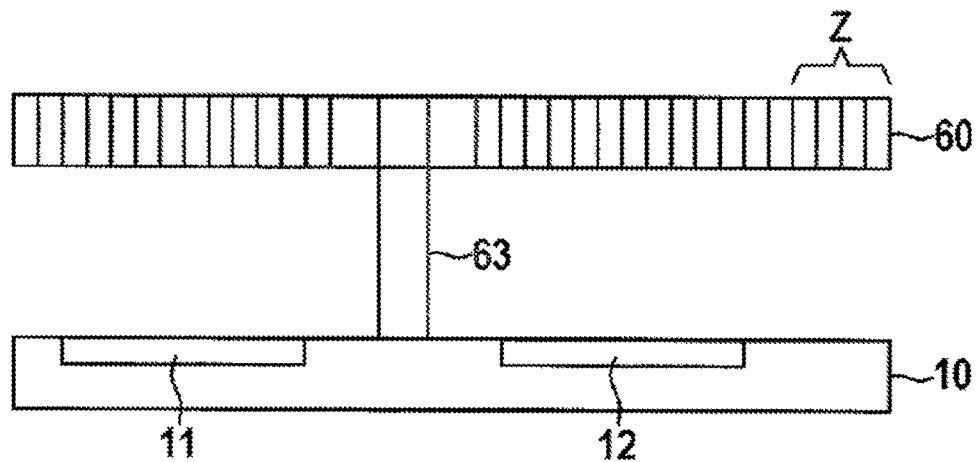
FIGS. 1-4 show movable mass elements of conventional micromechanical sensors in the form of a z acceleration sensor.

FIG. 1 shows in a greatly simplified form a conventional micromechanical sensor in the form of a z acceleration sensor based on the rocker principle, a rocker being formed in a third functional layer 60 (preferably a polysilicon functional layer). Electrodes 11, 12 are arranged on in a first functional layer 10 (preferably a polysilicon functional layer). The rocker can be twisted about a torsion spring 63 and in this way produces changes in capacitance, which are sensed and are a measure of the acceleration acting on the sensor. In this case, a mass of the left-hand rocker arm is less than a mass of the right-hand rocker arm and the left-hand rocker arm is shorter than the right-hand rocker arm. In the region of the right-hand rocker arm, an additional mass Z can be seen, with the effect of making the overall rocker mass asymmetrical.

Figure 2:
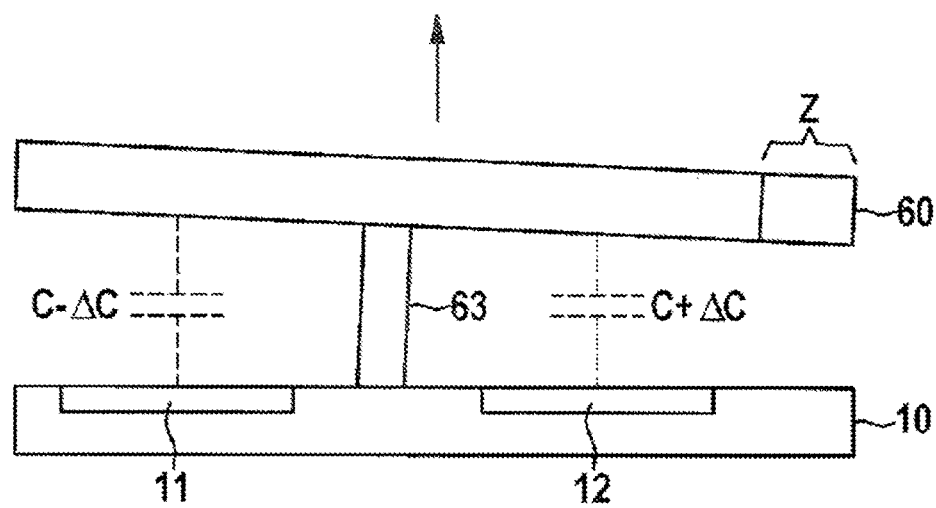

FIG. 2 shows that, when there is an acceleration on the rocker arm, the right-hand (heavier) rocker arm moves downward and the left-hand (lighter) rocker arm moves upward, triggered by an acceleration that is indicated by an arrow. The capacitance conditions that are brought about by the changing of the rocker are indicated formulaically on the two sides of the rocker.

Figure 3:
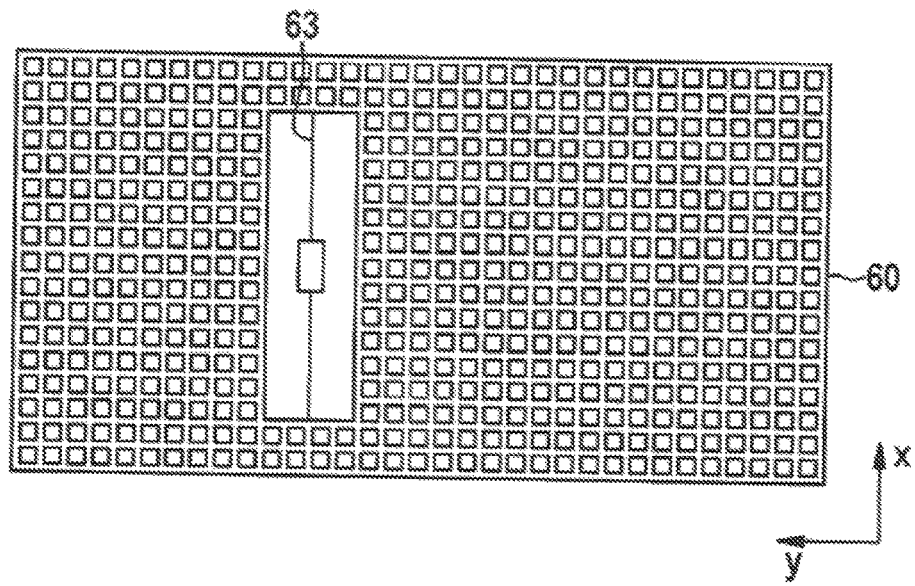

FIG. 3 shows a plan view of this conventional sensor, a perforation throughout the rocker region being evident.

Figure 4:
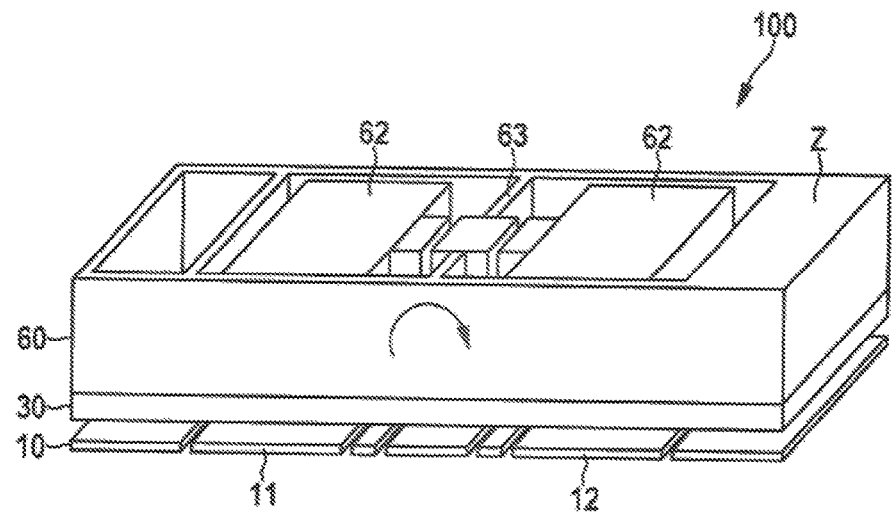

FIG. 4 shows a perspective representation of a z acceleration sensor known for example from DE 10 2009 000 167 A1. The structure comprises immovable bottom electrodes 11, 12 in the first functional layer 10 and immovable electrodes 62 (top electrodes) in the third functional layer 60. In the first functional layer 10, narrow conductor track leads for the electrodes 62 formed in the third functional layer 60 are formed near the torsion axis 63. The movable structure of the rocker is formed by elements of the second and third functional layers 30, 60. The left-hand rocker side is hollowed out in the outer region, while the right-hand side has an additional mass Z, thereby creating a difference in mass and a sensitivity to z accelerations. On the side facing the conductor track level, the two rocker arms are largely symmetrical. As a result, disruptive effects as a result of surface charges are suppressed in their effectiveness. Not shown in the figure for reasons of simplicity are perforation holes. All of the movable masses and also the electrodes 62 in the third functional layer 60 are perforated in a way similar to the structure from FIG. 3, in order to make it possible by etching with gaseous HF to achieve a release (i.e. removal of sacrificial oxides between the first and second functional layers and also between the second and third functional layers).

Figure 5:
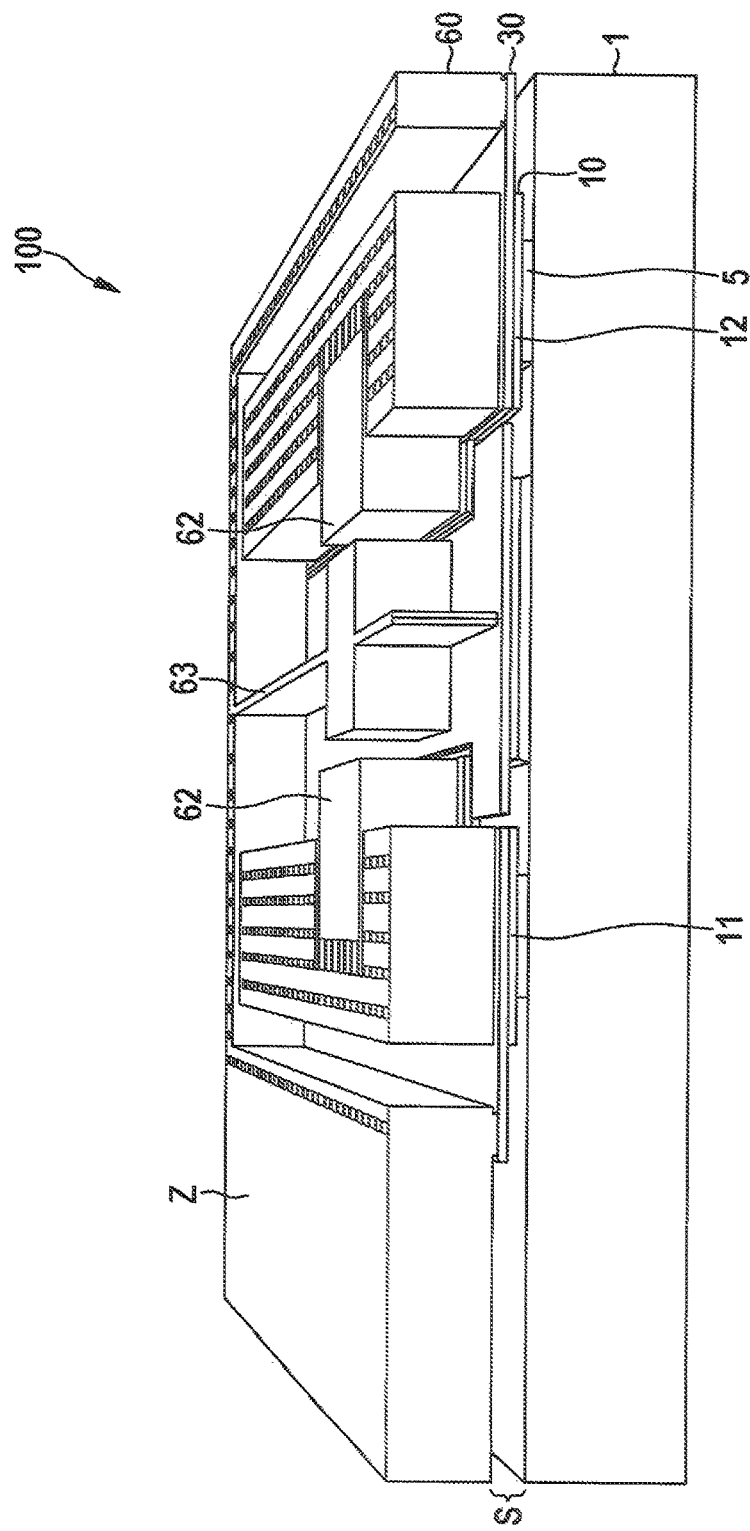
FIGS. 5-7 show views of an embodiment of a micromechanical sensor according to the disclosure.

FIG. 5 shows a perspective representation of a first embodiment of a micromechanical sensor 100 according to the disclosure. From a technological viewpoint, the sensor is formed like the structure from FIG. 4 substantially by three functional layers 10, 30, 60 with an oxide layer 20 lying in between. Elements of the first functional layer 10, elements of the second functional layer 30 and over them the elements of the third functional layer 60 can be seen. The fundamental topology is likewise similar to in FIG. 4, but with the following major differences:

i) The additional mass Z in the third functional layer 60 on the extreme left does not have any perforation holes apart from an inner series of holes, in the vicinity of which the structure of the third functional layer 60 is connected to the structure of the second functional layer 30, and is therefore substantially unperforated.

ii) The vertical gap S underneath the mentioned non-perforated region, that is to say the distance from the substrate 1, is significantly greater, typically by a factor of about two to about ten, preferably about three to about six, than a distance between the movable electrodes and the fixed bottom electrodes 11, 12 or top electrodes 62.

iii) Here there is no hollowed-out symmetrizing additional mass, as in FIG. 4, on the outside of the left-hand side.

Advantages of ii): On account of the large gap S, a squeeze film damping is not all that great, so that the damping of the z channel of the sensor does not deviate too much from a damping of x/y acceleration sensors. The contribution of the squeeze film damping is proportional to $1/d^3$, where d denotes the distance of the underside of the movable structure from the substrate or from the conductor track level. Furthermore, on account of the increased distance, the electrostatic interaction with the substrate, which is scaled with $1/d^2$, is quite small. As a result, effects caused by surface charges can be advantageously reduced greatly.

Advantage of iii): Since the effects caused by surface charges are greatly suppressed, there is no longer any need for symmetrizing the underside of the structure in relation to the substrate. This advantageously allows a saving in chip area, and moreover the mechanical sensitivity is increased. The hollowed-out symmetrizing mass on the extreme left in the structure from FIG. 4 does reduce the mechanical sensitivity of the micromechanical sensor, since it reduces the mass asymmetry. Doing without the symmetrizing, the mass asymmetry and the mechanical sensitivity of the sensor are consequently increased. Alternatively, in the proposed arrangement, a spring stiffness can be increased while maintaining the mechanical sensitivity, so that the restoring force from the mechanical stop is increased and the stiction tendency of the sensor is reduced.

Figure 6:
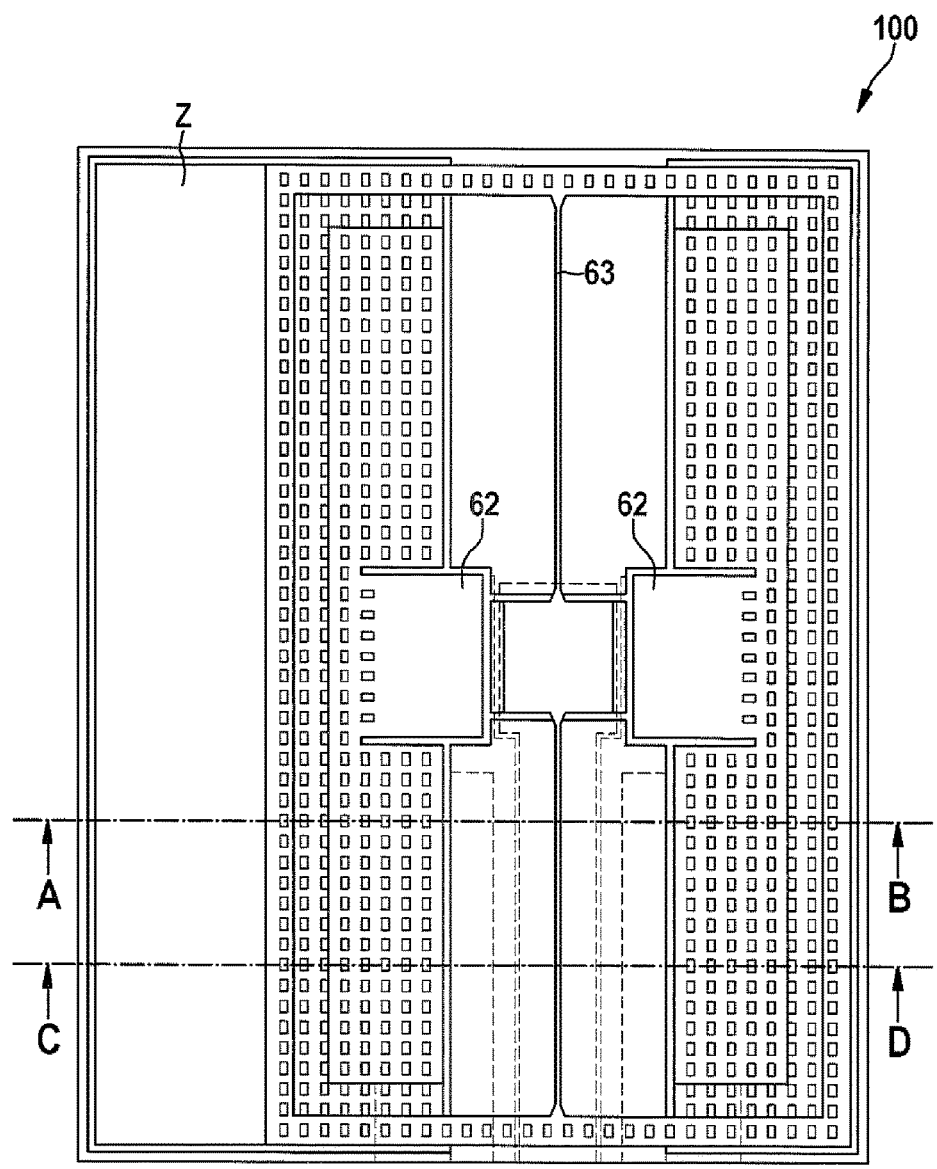

FIG. 6 shows a plan view of the proposed structure from FIG. 5 with two sections A-B and C-D.

Figure 7:
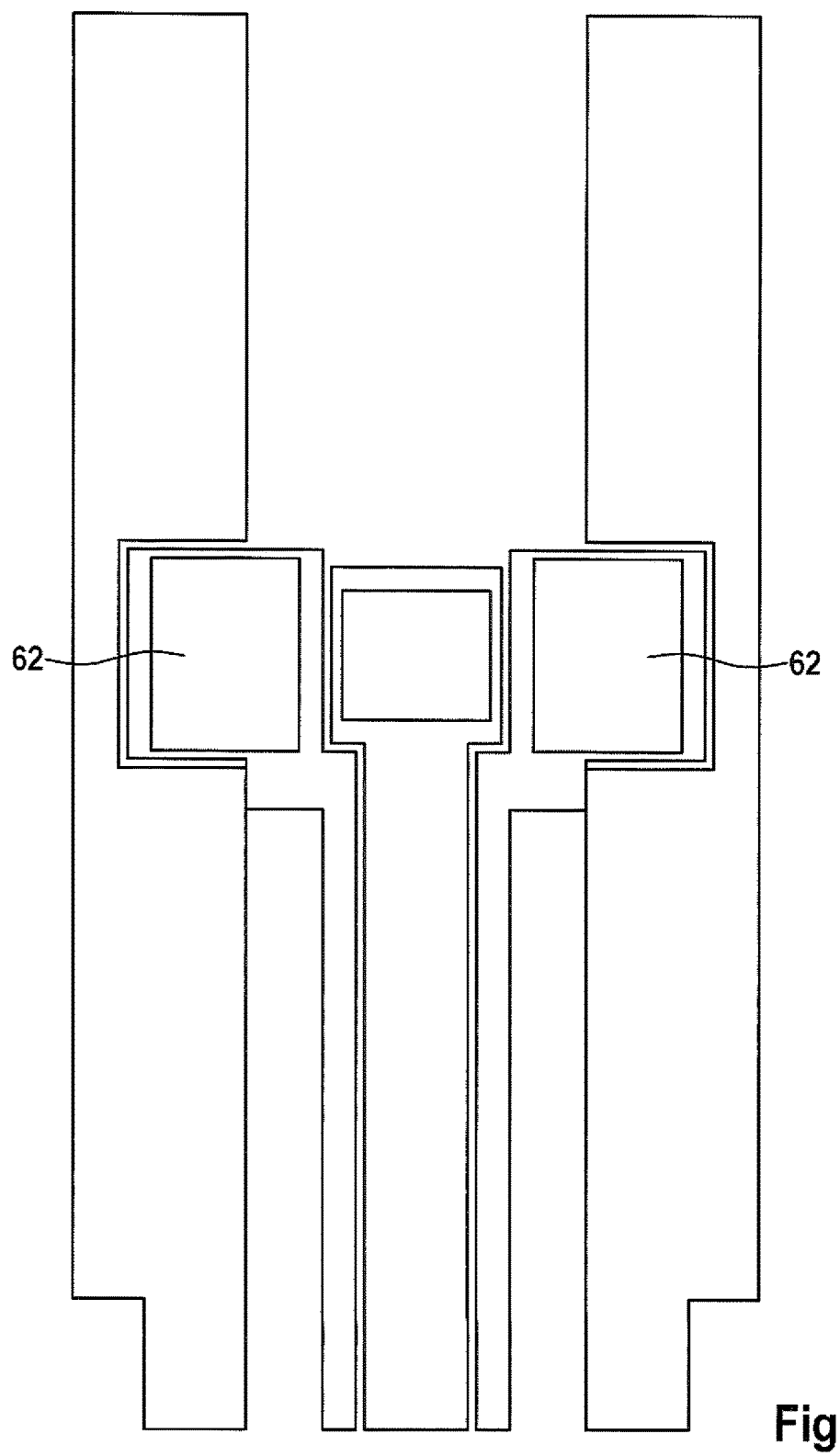

FIG. 7 shows for purposes of illustration a conductor track routing in the first functional layer 10 for the electrical activation of the structures from FIGS. 5 and 6.

FIG. 8 shows two cross-sectional views that are identical in principle along a section C-D of the structure from FIG. 6, the movable structures being depicted with different shading in the lower representation. It can be clearly seen that the gaps S underneath the unperforated mass of the third functional layer 60 is much greater than gaps underneath the perforated regions of the first functional layer 60 in relation to the first functional layer 10.

If the damping of the z acceleration sensor is to be reduced further, it goes without saying that it is still possible to form individual perforation holes or slots 61 in the additional mass Z. A corresponding exemplary embodiment is represented in plan view in FIG. 9.

Figure 9:
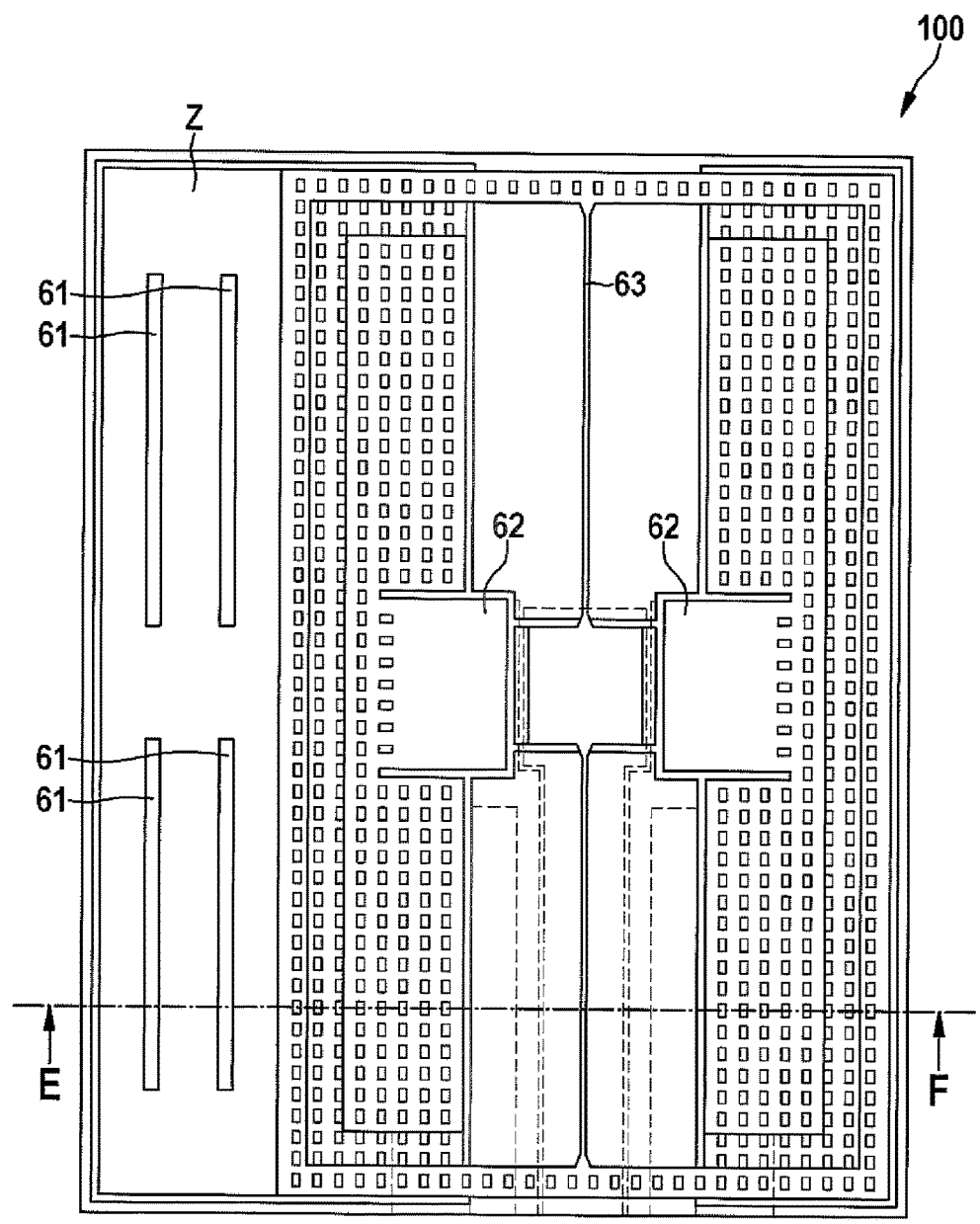

A sectional view along the section E-F from FIG. 9 is shown in FIG. 10. A further compromise between the damping properties and the parasitic electrostatic interaction between the movable structure and the substrate can be advantageously achieved. The cross-sectional images shown so far show a gap S in the region of the additional mass Z that is of a maximum size and in the case of which three sacrificial oxide layers and also the first and second functional layers 10, 30 have been cleared out.

It is alternatively possible for this purpose to remove underneath the additional mass Z just the second functional layer 30 and the sacrificial oxide lying thereover and thereunder, but to leave the conductor track level in the first functional layer 10 and give it the same electrical potential as the movable structure. As a result, the electrostatic interaction between the movable structure of the third functional layer 60 and the substrate is reduced, but on the other hand the damping is increased.

Which arrangement is most favorable depends on the respective sensor specification and the prioritization between various design criteria. FIG. 11 shows a cross-sectional view through such a modified structure.

Figure 12:
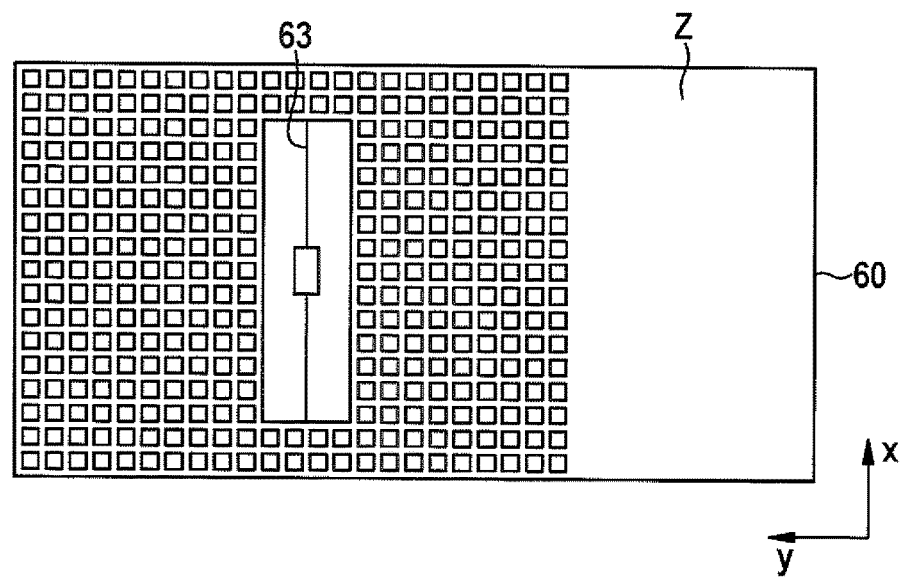
FIG. 12 shows a plan view of a further embodiment of the micromechanical sensor according to the disclosure.

In the case of a further advantageous embodiment of the micromechanical sensor 100, it is possible to provide the structure according to the disclosure of the, at least in portions, non-perforated additional mass Z with the large gap S ("substrate gap") without the fully differential electrode arrangement of FIGS. 4 to 11, i.e. with a standard rocker geometry analogous to the arrangement from FIG. 3. A corresponding embodiment is shown in plan view in FIG. 12.

A process sequence for forming the cavities under the non-perforated mass of the third functional layer 60 is shown in FIGS. 13 to 21. All of the layers are deposited on the basis of surface-micromechanical principles, a layer sequence being built up beginning from the bottom in the upward direction.

Figure 13:
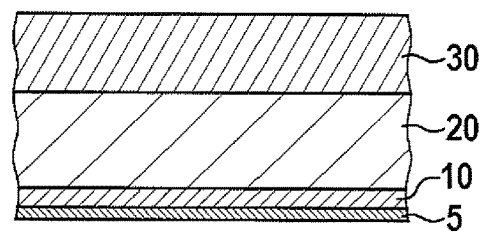
FIGS. 13-21 show a schematic process flow for producing a micromechanical sensor according to the disclosure.

FIG. 13 shows a general layer sequence with a first functional layer 10, it being possible to see underneath the first functional layer 10 a first oxide layer 5 on a substrate (not shown).

A second oxide layer 20 is deposited onto the first functional layer 10, a second functional layer 30 being deposited onto the second oxide layer 20.

Figure 14:
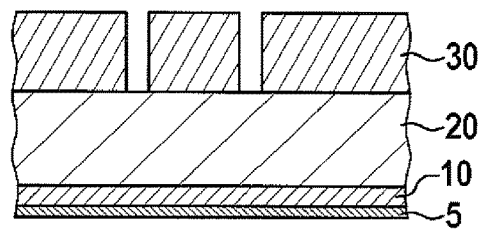
Figure 15:
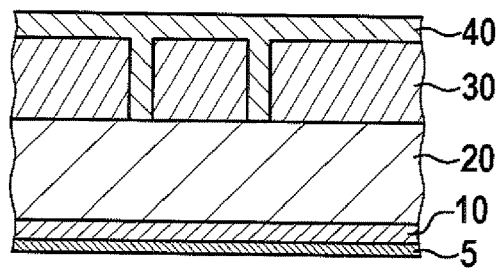

FIG. 14 shows that firstly thin vertical channels are etched into the second functional layer 30 and, as can be seen in FIG. 15, are sealed with a third oxide layer 40.

Figure 16:
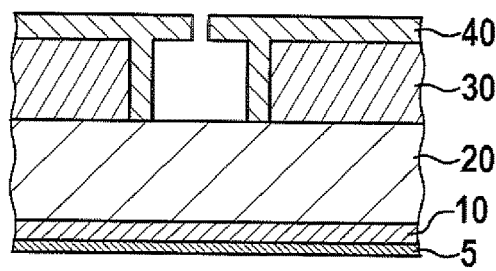
Figure 17:
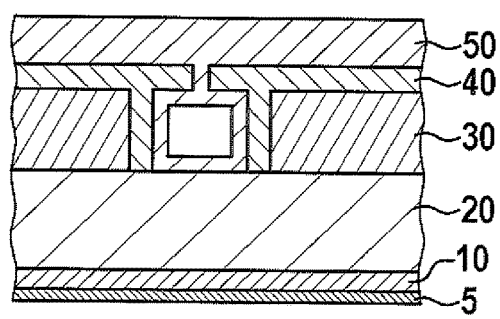

In FIG. 16 it can be seen that the third oxide layer 40 is locally opened at the top and an SF6 etching is introduced through this access, with the effect of etching out the second functional layer 30 through the third oxide layer 40 as far as the passivation. The sequence continues with the application of a fourth oxide layer 50, which seals the opening in the third oxide layer 40 again, but only partially fills the interior space within the third oxide layer 40, whereby a cavity or a lateral channel ("fuze") is created (see FIG. 17).

Figure 18:
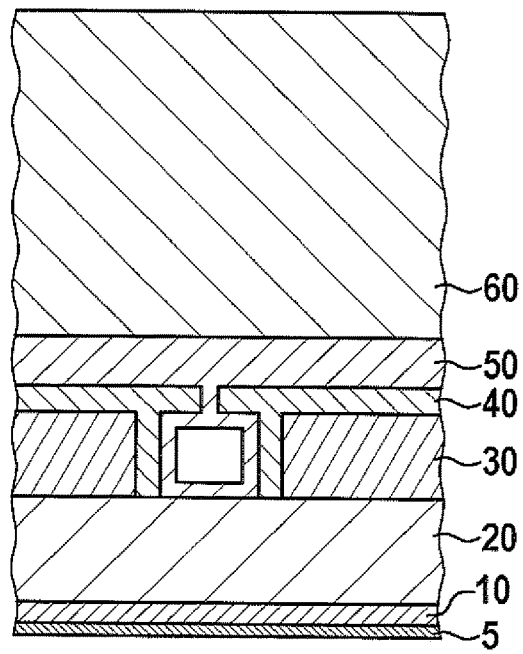

As can be seen in FIG. 18, the third functional layer 60 of the sensor core is then applied to this sequence of layers. The fuze in this case lasts until the gas phase etching, that is to say the release of the MEMS structure with gaseous HF.

Figure 19:
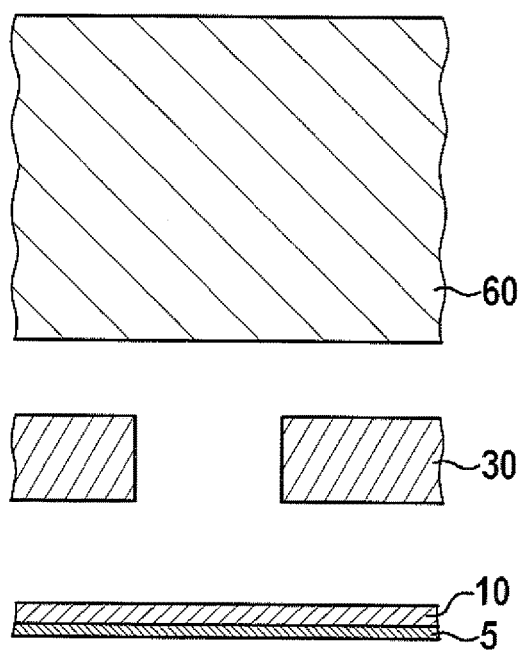

FIG. 19 shows a cross section through the structure after the etching operation has taken place. It can be seen that the regions with the oxide layers 20, 40 and 50 have now been removed completely, so that only an arrangement comprising the first functional layer 10 on the first oxide layer 5, the second functional layer 30 and the third functional layer 60 remains.

Figure 20:
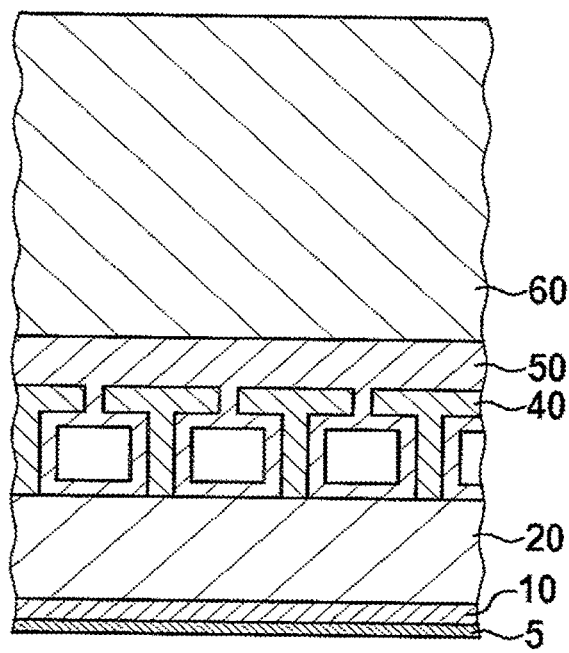

It is preferred, as indicated in FIG. 20, to place a number of fuzes (preferably parallel) next to one another in the manner of a grid, whereby greater regions of the second functional layer 30 can be removed. If a grid comprising longer fuzes is arranged underneath an unperforated structure of the third functional layer 60 and it is provided that the etching gas can reach the cavity within the fuze at at least one point during the gas phase etching, it expands as it were explosively within the cavity.

This is achieved by providing a vertical access channel (not shown) in the third functional layer 60, preferably in the form of a slot, whereby a gaseous etching medium can be fed into a number, preferably into all of the fuzes at the same time ("simultaneous detonation of all the fuzes"). As a result, there is etching gas over the entire length of the fuzes, with the effect of then etching away both the fuzes consisting of oxide material and the oxide material thereover and thereunder. Overall, regions over large areas of the second functional layer 30 underneath the substantially non-perforated third functional layer 60 can in this way be removed in a layout-controlled manner.

Figure 21:
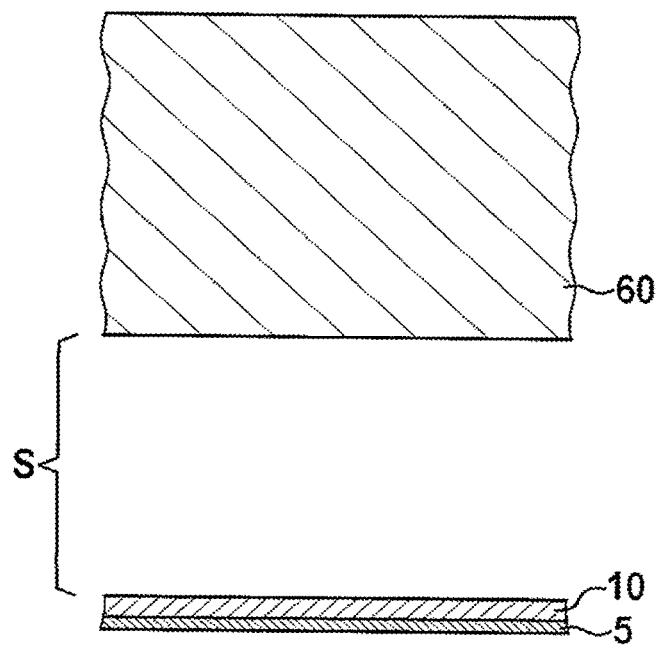

As can be seen in FIG. 21, the result is that underneath the third functional layer 60 a large gap S between the third functional layer 60 and the first functional layer 10 can be obtained.

Even if up until now the second functional layer 30 has been shown in all of the figures as thin in comparison with the third functional layer 60, the surface-micromechanical process flow that is used is advantageously largely independent of the layer thickness of the second functional layer 30. It is therefore possible in principle to form the second functional layer 30 much thicker, for example half as thick or just as thick as the third functional layer 60.

This allows the free space underneath the unperforated mass of the third functional layer 60 (for example in the form of an additional mass Z of a micromechanical z acceleration sensor or a mass of a micromechanical lateral sensor or rate-of-rotation sensor) to be increased further, and the positive properties of the arrangement (for example little squeeze film damping, little electrostatic interaction) to be further enhanced. It is therefore advantageously possible to dimension and design the second functional layer 30 flexibly, and in this way form a defined gap S underneath the unperforated additional mass of the third functional layer 60.

With the micromechanical sensor that can be obtained as a result, an increased robustness with respect to instances of substrate bending and an improved robustness with respect to surface charges can be provided. Furthermore, a damping is adjustable, comparable with an x/y sensor. Furthermore, a mechanical sensitivity and a restoring force are advantageously increased and an overall height of the sensor is reduced.

Figure 22:
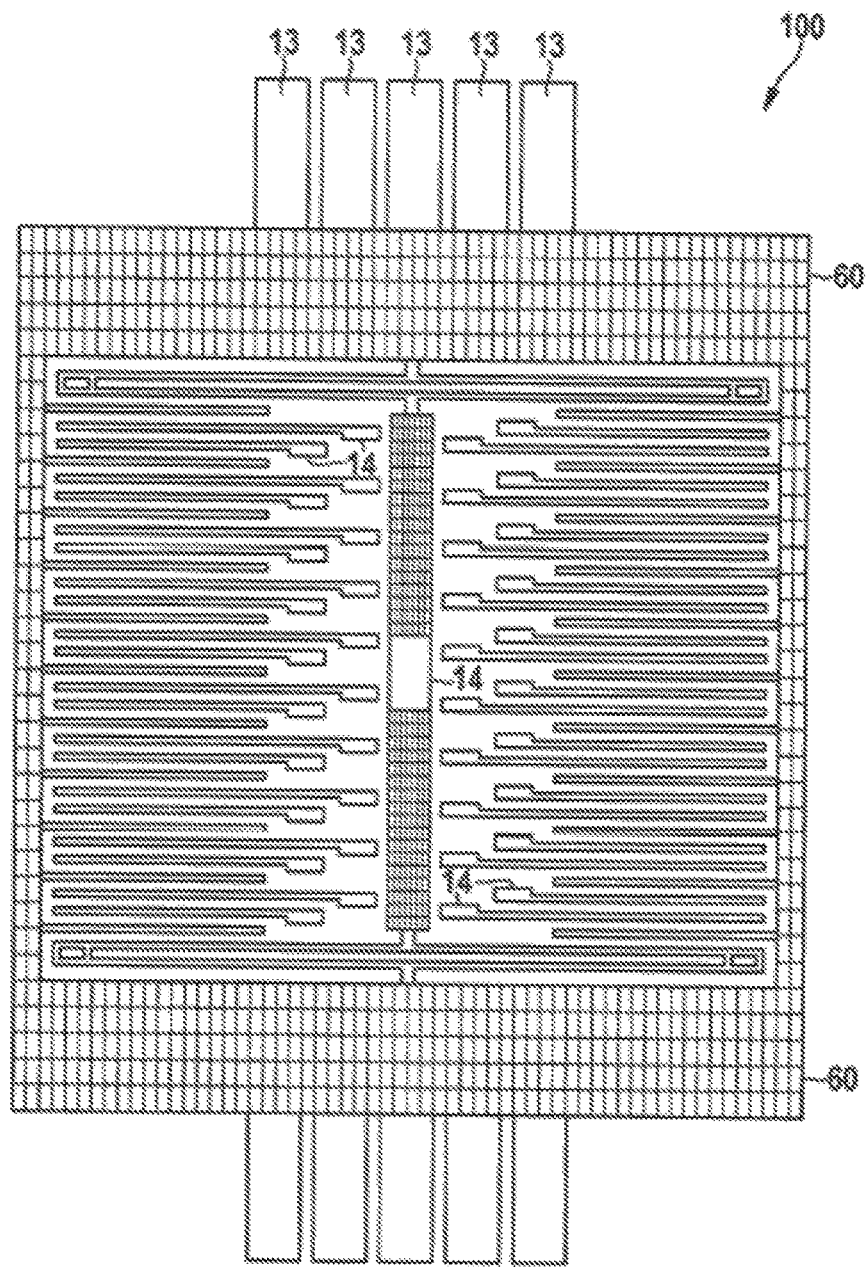
FIG. 22 shows a plan view of a conventional micromechanical sensor in the form of a lateral acceleration sensor.

FIG. 22 shows a plan view of a conventional micromechanical sensor 100 in the form of a lateral acceleration sensor with perforated mass structures in the third functional layer 60. Connecting elements 14 for connecting structures of the first functional layer 10 to structures of the third functional layer 60 can be seen. Lead structures 13 for electrically attaching the electrodes in the first functional layer 10 can also be seen.

Figure 23:
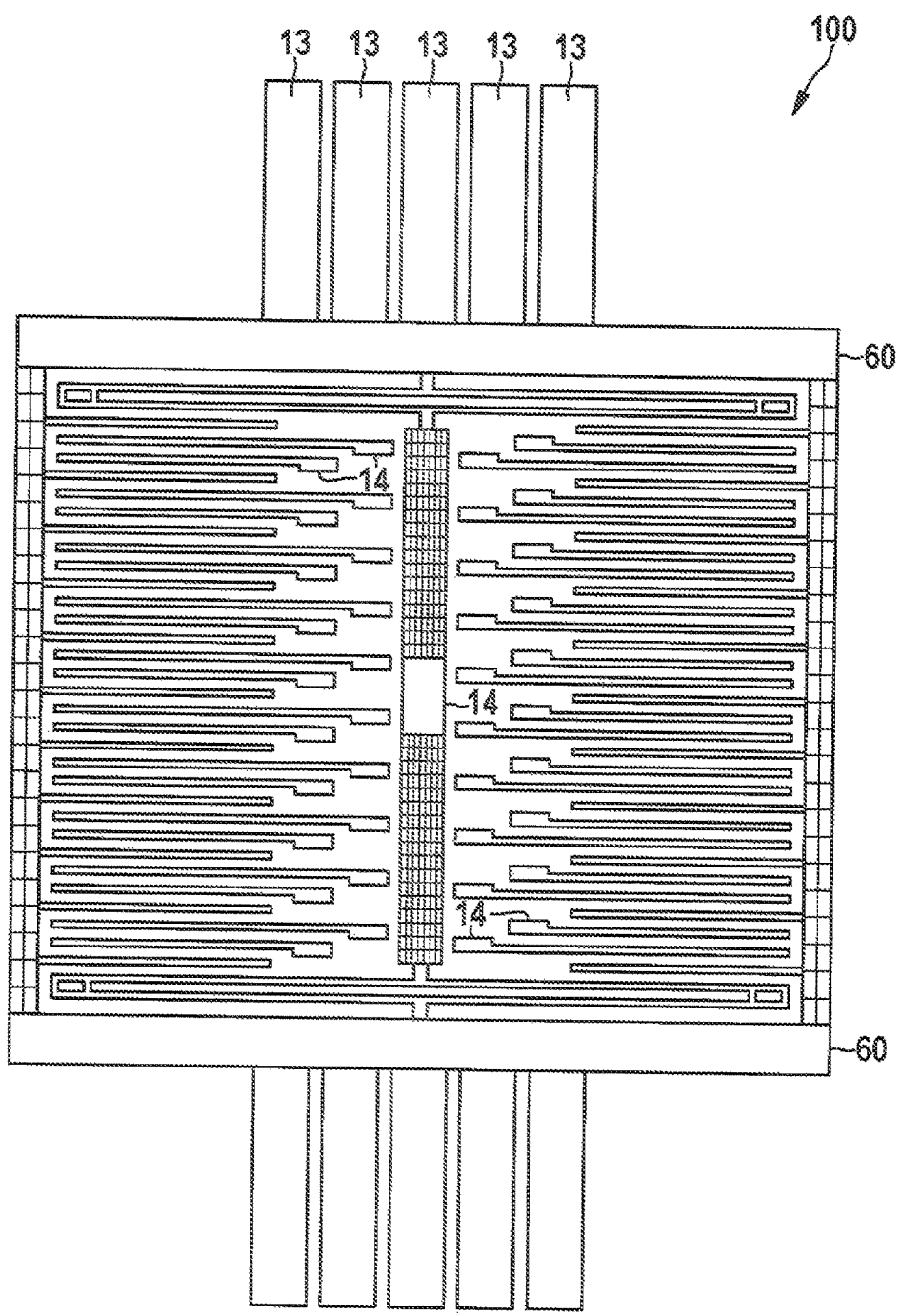
FIG. 23 shows a plan view of an embodiment of a micromechanical sensor according to the disclosure in the form of a lateral acceleration sensor.

FIG. 23 shows a plan view of a micromechanical sensor 100 according to the disclosure in the form of a lateral acceleration sensor. By doing substantially completely without the perforation of the mass of the third functional layer 60, the sensor has the same mass and mechanical sensitivity as the conventional lateral acceleration sensor from FIG. 22, but a significantly reduced core area. Otherwise, the structure corresponds to the arrangement from FIG. 22.

Figure 24:
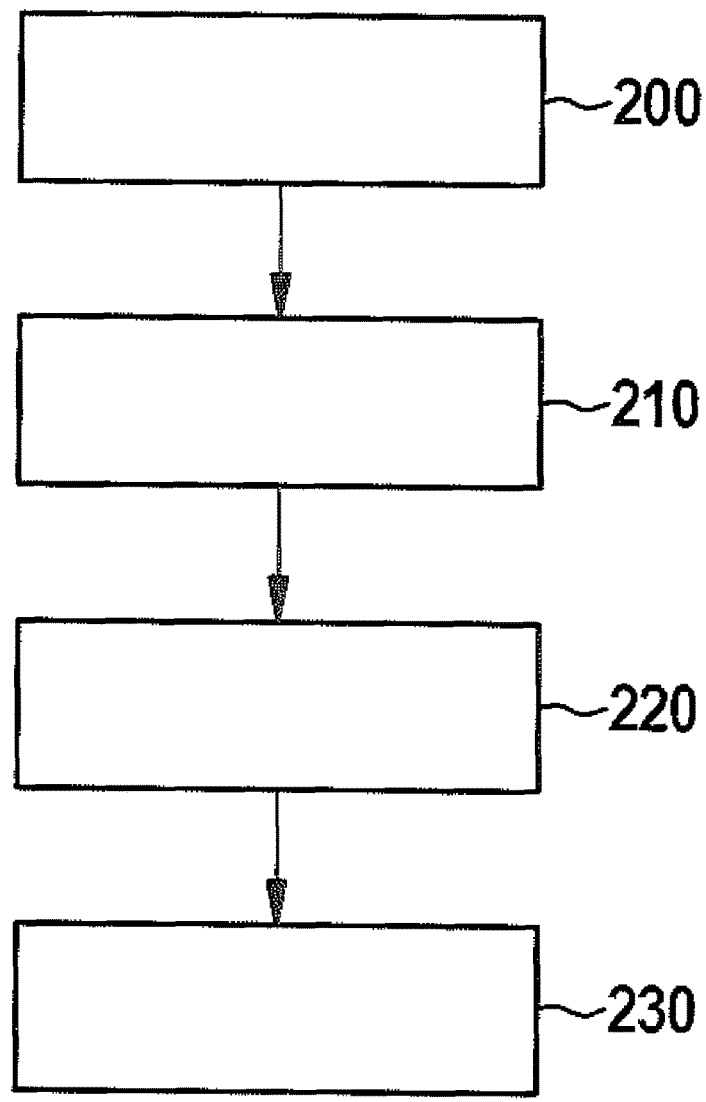
FIG. 24 shows a basic sequence of a method for producing a micromechanical sensor according to the disclosure.

FIG. 24 shows a basic sequence of the proposed method:

In a step 200, a layer-by-layer formation of a first functional layer 10, a second functional layer 30 and a third functional layer 60 is carried out, an oxide layer being respectively formed between the functional layers 10, 30, 60.

In a step 210, a defined removal of the second functional layer and a formation of a defined number of lateral, oxidized etching channels in the region of the second functional layer 30 are carried out.

In a step 220, a formation of a vertical access channel into the lateral etching channels, in particular an access channel in the first functional layer 10, is carried out.

In a step 230, a defined removal of the oxide layers is carried out by introducing a gaseous etching medium into the lateral etching channels.

To sum up, the present disclosure proposes a micromechanical sensor that can be produced by means of a surface-micromechanical method and has an increased gap between a mass of a third functional layer and a layer lying thereunder. In this way, electrostatic interactions between the mass and the layer lying thereunder are advantageously reduced. Furthermore, parasitic effects of squeeze film damping are also advantageously reduced.

Although the disclosure has been described above on the basis of specific application examples, a person skilled in the art can also implement embodiments that are not disclosed, or only partially disclosed, above without departing from the essence of the disclosure.

What is claimed is:

1. A micromechanical sensor configured to be produced surface-micromechanically, comprising:
   a third functional layer defining at least one movable mass element that includes:
      a first portion that is at least substantially unperforated; and
      a second portion that is perforated;
   wherein:
      the third functional layer is positioned so as to form a first gap located underneath the first portion, and a second gap located underneath the second portion; and
      the first gap is about two to about ten times greater than the second gap.

2. The micromechanical sensor according to claim 1, wherein the first gap is about five μm to about eight μm.

3. The micromechanical sensor according to claim 2, wherein the first gap is about seven μm.

4. The micromechanical sensor according to claim 1, wherein the first portion includes a defined number of through-holes located exclusively in a side region of the first portion facing toward the second portion such that the first portion is substantially unperforated.

5. The micromechanical sensor according to claim 1, further comprising a first functional layer that defines a conductor track level underneath the first portion of the at least one movable mass element.

6. The micromechanical sensor according to claim 1, further comprising a substrate disposed underneath the first portion of the at least one movable mass element.

7. The micromechanical sensor according to claim 1, wherein the first gap is about three to about six times greater than the second gap.

8. The micromechanical sensor according to claim 1, wherein the sensor is at least one of an accelerometer and a rotation sensor.

9. The micromechanical sensor according to claim 8, further comprising:
   a torsion spring; and
   a pair of bottom electrodes that are fixed relative to the at least one movable mass element on opposite sides of the torsion spring;
   wherein:
      the at least one movable mass element is a mass asymmetrical rocker rotatably supported by the torsion spring;
      the rocker includes a pair of top electrodes that are positioned on opposite sides of the torsion spring such that each top electrode forms a respective capacitance pair with a corresponding bottom electrode; and
      an acceleration or rotation of the sensor causes the rocker to twist about the torsion spring, resulting in a relative change in capacitance between the capacitance pairs that is indicative of the acceleration or rotation.

10. A micromechanical device configured to be produced surface-micromechanically, comprising:
    a third functional layer that defines a vertical slot;
    at least one oxide layer positioned underneath the third functional layer; and
    a second functional layer positioned underneath the third functional layer and including at least one horizontal etching channel in communication with the vertical slot such that introducing gaseous etching material into the at least one horizontal etching channel via the vertical slot removes the at least one oxide layer and the second functional layer from the device and forms a first gap underneath the third functional layer.

11. The micromechanical device according to claim 10, wherein the at least one horizontal etching channel is positioned such that the first gap is formed underneath an unperforated portion of the third functional layer.

12. The micromechanical device according to claim 11, wherein the at least one oxide layer includes:
    a first oxide layer positioned underneath the second functional layer;
    a second oxide layer positioned at least partially within the second functional layer so as to at least partially define the at least one horizontal etching channel; and
    a third oxide layer positioned between the third functional layer and the second oxide layer so as to vertically seal off the at least one horizontal etching channel.

13. The micromechanical device according to claim 12, further comprising a first functional layer positioned underneath the first oxide layer.

14. The micromechanical device according to claim 13, further comprising a further oxide channel positioned underneath the first functional layer.

15. The micromechanical device according to claim 10, wherein the at least one oxide layer and the second functional layer together have a thickness such that the gap forms with a size of about five μm to about eight μm.

* * * * *